_(12)_ United States Patent
Ozeki et al.

(10) Patent No.: US 10,824,041 B2
(45) Date of Patent: Nov. 3, 2020

(54) DISPLAY DEVICE

(71) Applicant: Japan Display Inc., Minato-ku (JP)

(72) Inventors: Yoshitaka Ozeki, Tokyo (JP); Koji Ishizaki, Tokyo (JP); Takahiro Takeuchi, Tokyo (JP); Koshiro Moriguchi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 210 days.

(21) Appl. No.: 16/143,765

(22) Filed: Sep. 27, 2018

(65) Prior Publication Data

US 2019/0094645 A1 Mar. 28, 2019

(30) Foreign Application Priority Data

Sep. 28, 2017 (JP) ................................. 2017-189149

(51) Int. Cl.
*G02F 1/167* (2019.01)
*H01L 27/12* (2006.01)
*H01L 29/786* (2006.01)
*G02F 1/16766* (2019.01)
*G02F 1/1676* (2019.01)

(52) U.S. Cl.
CPC .......... *G02F 1/167* (2013.01); *G02F 1/16766* (2019.01); *H01L 27/124* (2013.01); *H01L 27/1255* (2013.01); *H01L 29/78645* (2013.01); *G02F 1/1676* (2019.01); *G02F 2201/121* (2013.01); *G02F 2201/123* (2013.01)

(58) Field of Classification Search
CPC .... G02F 1/167; G02F 1/1676; G02F 1/16766; G02F 2201/121; G02F 2201/123; H01L 27/124; H01L 27/1255; H01L 29/78645
See application file for complete search history.

(56) References Cited

U.S. PATENT DOCUMENTS

2019/0081085 A1* 3/2019 Ozeki ................. G02F 1/16766
2019/0101801 A1* 4/2019 Ozeki .................. G02F 1/1368

FOREIGN PATENT DOCUMENTS

JP 2011-221097 11/2011

OTHER PUBLICATIONS

Machine translation of JP 2011 221097, downloaded from ESPACENET Jun. 29, 2020 (Year: 2020).*

* cited by examiner

*Primary Examiner* — Cara E Rakowski
(74) *Attorney, Agent, or Firm* — Oblon, McClelland, Maier & Neustadt, L.L.P.

(57) ABSTRACT

According to one embodiment, a display device includes a switching element including a source electrode and a drain electrode, an inorganic insulating film in contact with the source electrode and the drain electrode, a metal film in contact with the inorganic insulating film and including an opening in a position superimposed on the drain electrode, a capacitor insulating film covering the metal film, an pixel electrode located on the capacitor insulating film and electrically connected to the drain electrode, an electrophoretic element located on the pixel electrode and a common electrode located on the electrophoretic element, and the metal film includes a forward tapered end portion in the opening.

20 Claims, 7 Drawing Sheets

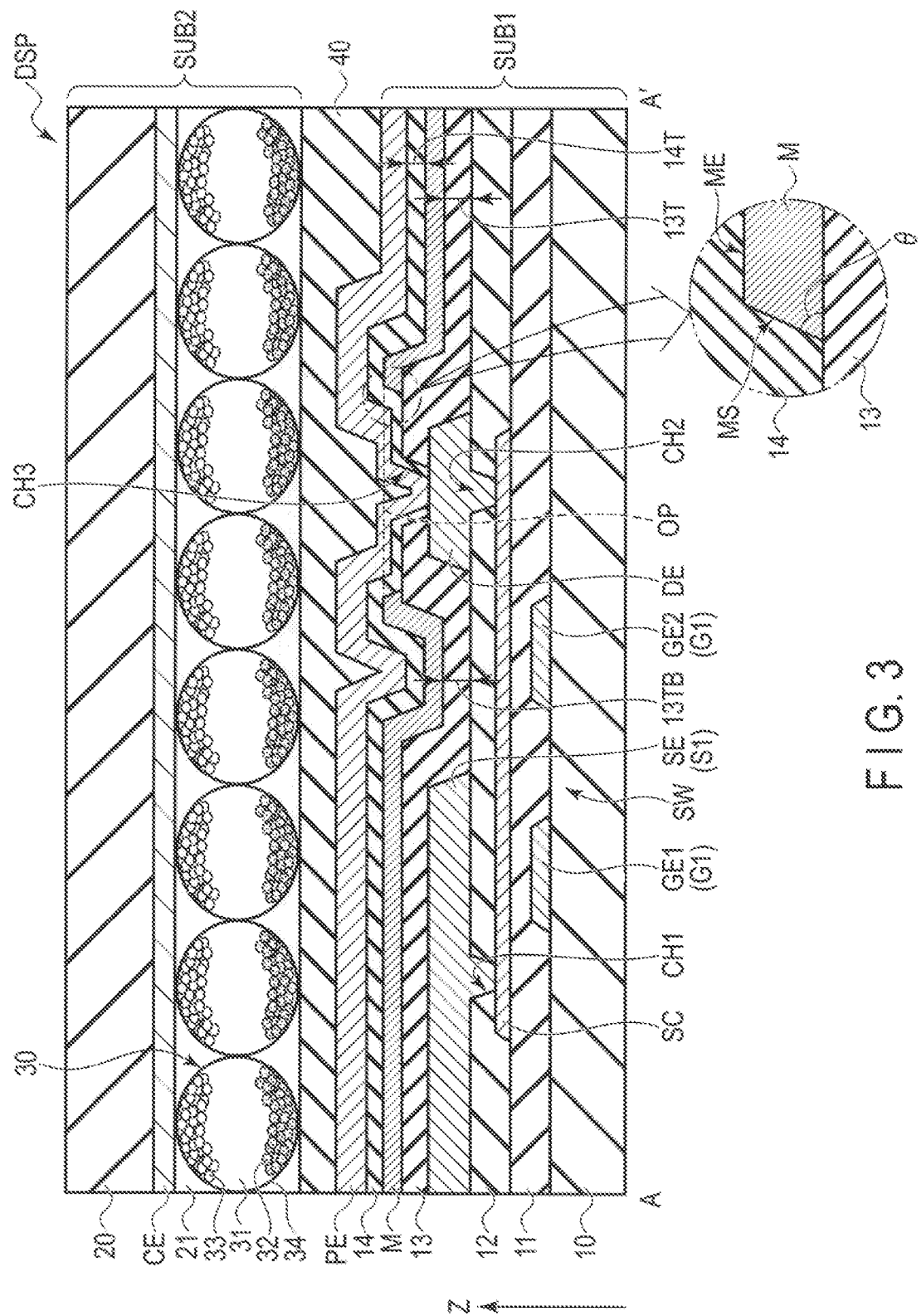
F I G. 3

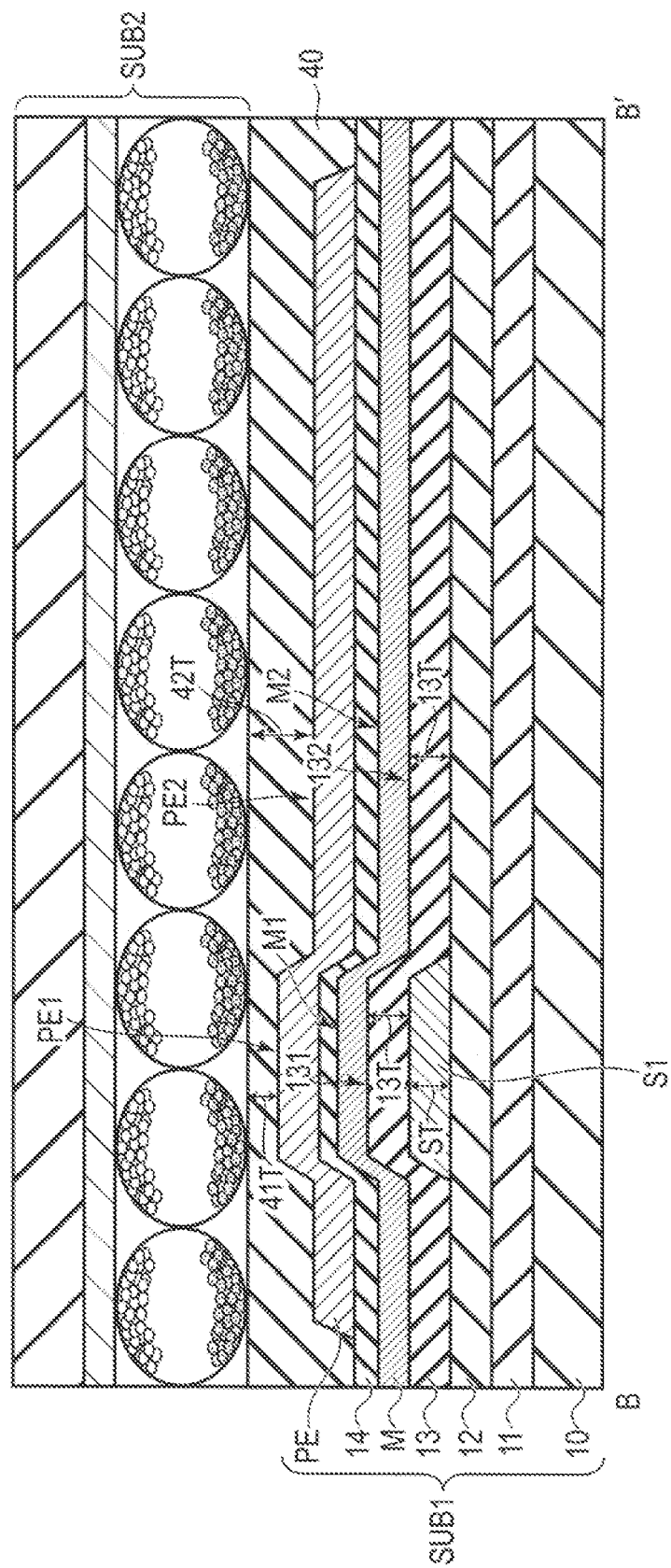
F I G. 4

DISPLAY DEVICE

CROSS-REFERENCE TO RELATED APPLICATIONS

This application is based upon and claims the benefit of priority from Japanese Patent Application No. 2017-189149, filed Sep. 28, 2017, the entire contents of which are incorporated herein by reference.

FIELD

Embodiments described herein relate generally to a display device.

BACKGROUND

For example, an electrophoretic display device having a structure in which an electrophoretic element in which microcapsules are arranged is held between an element substrate and a counter-substrate, has been disclosed. Electrophoretic display devices of this type have memorability and therefore they do not need to apply voltage to maintain a display state at all times. On the other hand, the electrophoretic display devices need to have a storage capacitance in order to hold voltage for a certain period in each pixel. Such a storage capacitance is constituted by, for example, a storage capacitance electrode formed form a light-shielding metal film, a protective film and a pixel electrode.

BRIEF DESCRIPTION OF THE DRAWINGS

FIG. 3 is a cross section of the pixel PX shown in FIG. 2, taken along line A-A'.

FIG. 4 is a cross section of the pixel PX, taken along line B-B' in FIG. 2, which crosses a signal line S1.

DETAILED DESCRIPTION

Figure 1:
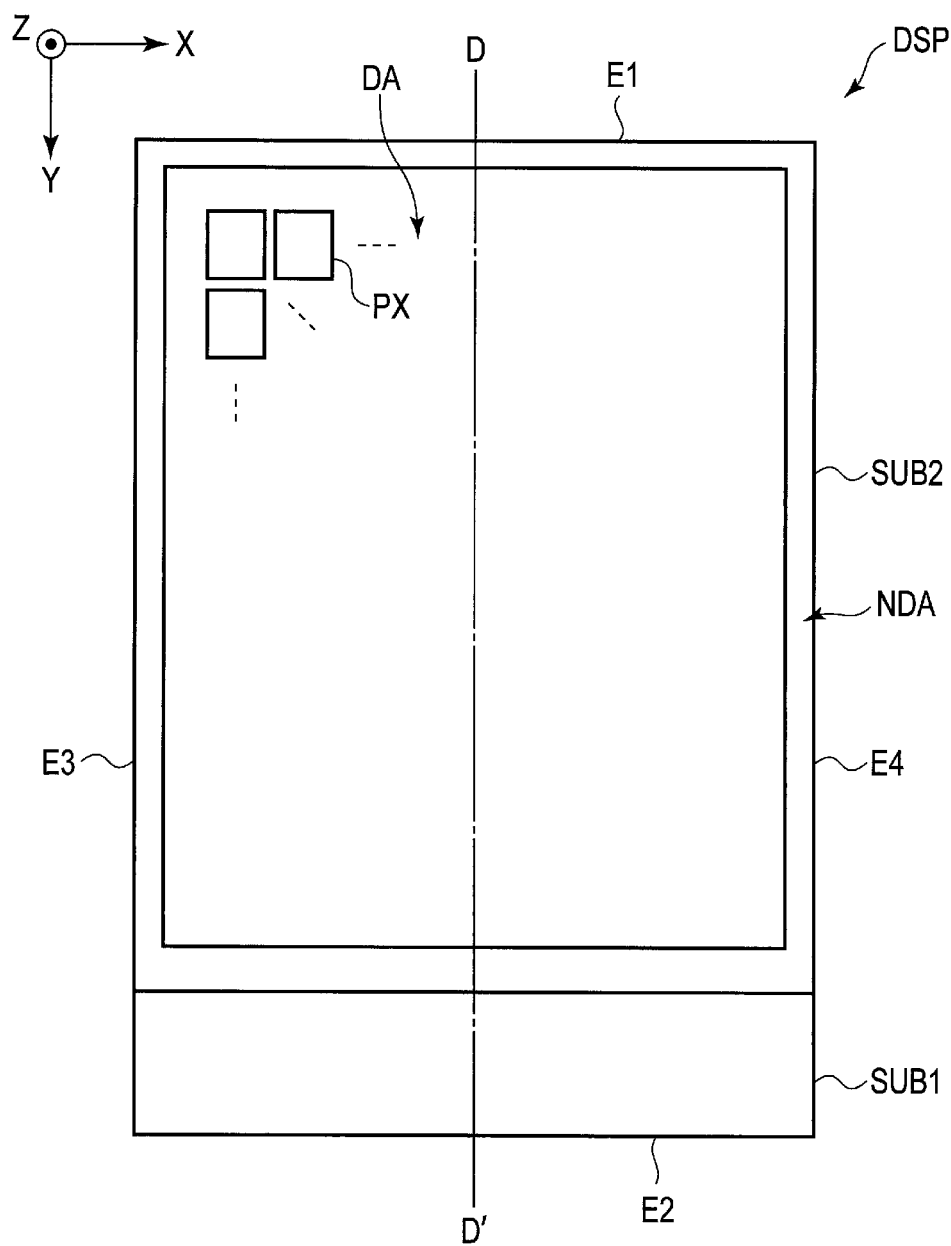
FIG. 1 is a plan view showing a configuration example of a display device DSP of one of the embodiments.

In general, according to one embodiment, a display device comprises a switching element comprising a source electrode and a drain electrode, an inorganic insulating film in contact with the source electrode and the drain electrode, a metal film in contact with the inorganic insulating film and comprising an opening in a position superimposed on the drain electrode, a capacitor insulating film covering the metal film, an pixel electrode located on the capacitor insulating film and electrically connected to the drain electrode, an electrophoretic element located on the pixel electrode and a common electrode located on the electrophoretic element, and the metal film includes a forward tapered end portion in the opening.

According to another embodiment, a display device comprises a first substrate comprising a base material, a switching element located on the base material and including a source electrode and a drain electrode, an inorganic insulating film in contact with the source electrode and the drain electrode, a metal film in contact with the inorganic insulating film and comprising an opening in a position superimposed on the drain electrode, a capacitor insulating film covering the metal film, and a pixel electrode located on the capacitor insulating film and electrically connected to the drain electrode, a second substrate comprising a common electrode, an electrophoretic element located between the pixel electrode and the common electrode and a sealing member disposed around the second substrate and the electrophoretic element, and the first substrate includes a first end portion and a second end portion on an opposite side to the first end portion, the sealing member is in contact with an end surface of each of the inorganic insulating film and the capacitor insulating film in the first end, and the sealing member is in contact with an upper surface of the capacitor insulating film in the second end.

The embodiments will be described hereinafter with reference to the accompanying drawings. Note that the disclosure is presented for the sake of exemplification, and any modification and variation conceived within the scope and spirit of the invention by a person having ordinary skill in the art are naturally encompassed in the scope of invention of the present application. In addition, in some cases, in order to make the description clearer, the widths, thicknesses, shapes, etc., of the respective parts are schematically illustrated in the drawings and compared to the actual modes. However, the schematic illustration is merely an example, and adds no restrictions to the interpretation of the invention. In addition, in the specification and drawings, the structural elements, which have functions identical or similar to the functions described in connection with preceding drawings, are denoted by like reference numbers, and an overlapping detailed description thereof is omitted unless otherwise necessary.

FIG. 1 is a plan view showing a configuration example of a display device DSP of one of the embodiments. In the figure, a first direction X and a second direction Y are directions intersecting each other, and a third direction Z is a direction intersecting the first direction X and the second direction Y. For example, the first direction X, the second direction Y and the third direction Z are orthogonal to each other, but they may cross each other at an angle other than 90 degrees. In this specification, a direction indicated by the tip of the arrow along the third direction Z is referred to as upward (or simply, up), and a direction opposite to that indicated by the tip of the arrow is referred to as downward (or simply, down). Further, when it is assumed that an observation position at which the display device DSP is to be observed is located at the pointing end side of the arrow indicating the third direction Z, a view toward an X-Y plane defined by the first direction X and the second direction Y is referred to as a plan view.

The display device DSP comprises a first substrate SUB1 and a second substrate SUB2. The display device DSP comprises a display area DA which displays images and a non-display area NDA surrounding the display area DA. The non-display area NDA is formed in a frame shape. The display area DA is located in a region where the first substrate SUB1 and the second substrate SUB2 superimpose each other in plan view. The display area DA includes a plurality of pixels PX arrayed in a matrix.

The display device DSP comprises edges E1 and E2 extending along the first direction X, and edges E3 and E4 extending along the second direction Y.

Figure 2:
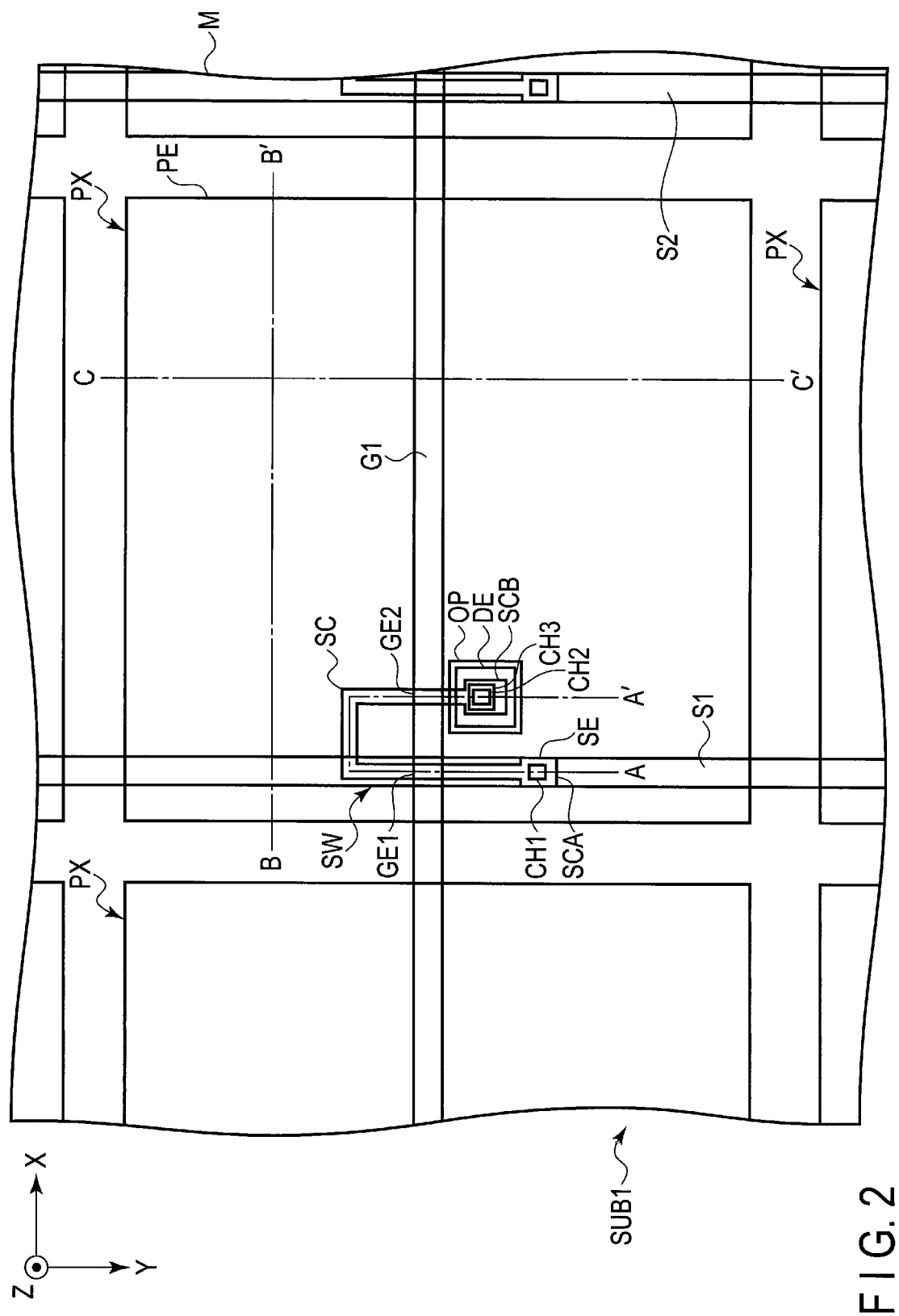
FIG. 2 is a plan view showing a pixel PX of the display device DSP shown in FIG. 1.

FIG. 2 is a plan view of a pixel PX of the display device DSP shown in FIG. 1. Of the pixel PX, here, only main elements of the first substrate SUB1 shown in FIG. 1 are illustrated. The pixel PX comprises a switching element SW, a metal film M and a pixel electrode PE. The switching element SW comprises gate electrodes GE1 and GE2, a semiconductor layer SC, a source electrode SE and a drain electrode DE. The switching element SW illustrated has a double gate structure, but it may have a single gate structure. Moreover, the switching element SW may be of a top-gate structure in which the gate electrodes GE1 and GE2 are disposed above the semiconductor layer SC, or may be of a bottom-gate structure in which the gate electrodes GE1 and GE2 are disposed under the semiconductor layer SC.

The semiconductor layer SC is electrically connected, by one end portion SCA thereof, to a signal line S1 via a contact hole CH1, and also electrically connected, by the other end portion SCB, to the drain electrode DE via a contact hole CH2. The semiconductor layer SC crosses a scanning line G1 between the one end portion SCA and the other end portion SCB.

The gate electrodes GE1 and GE2 correspond to regions of the scanning line G1, which are superimposed on the semiconductor layer SC. In the example illustrated, the scanning line G1 extends along the first direction X, and crosses a central portion of the pixel PX. The source electrode SE includes a region of the signal line S1, which is in contact with the semiconductor layer SC. In the example illustrated, the signal line S1 extends along the second direction Y and is located in a left-hand side end portion of the pixel PX. The drain electrode DE is formed into an island-like shape and is located between the signal lines S1 and S2.

The metal film M is superimposed on a plurality of pixels PX arranged along the first direction X and the second direction Y, and is superimposed on both the scanning line G1 and the signal line S1. In each pixel PX, the metal film M comprises an opening OP in a position superimposed on the drain electrode DE. The metal film M is formed throughout substantially the entire region of the display area DA shown in FIG. 1. To the metal film M, a common potential is supplied in, for example, the non-display area NDA.

The pixel electrode PE overlaps the metal film M, the switching element SW, the scanning line G1 and the signal line S1 in the pixel PX. The pixel electrode PE is electrically connected to the drain electrode DE via the contact hole CH3 and the opening OP. In the example illustrated, the pixel electrode PE is formed into a square shape with edges of the same length along the first direction X and the second direction Y, but the shape is not limited to this. The pixel electrode PE may have a rectangular shape elongated in the first direction X or the second direction Y, or may be of some other polygon.

The portion where the metal film M and the pixel electrode PE overlap in plan view is equivalent to a storage capacitance of each pixel PX. In the example illustrated, the metal film M is formed all over the entire surface of the pixel PX, and with this structure, substantially the entire region where the pixel electrode PE is formed, is superimposed on the metal film M, to form the storage capacitance.

FIG. 3 is a cross section of the pixel PX taken along line A-A' shown in FIG. 2. The first substrate SUB1 and the second substrate SUB2 are bonded to each other by an adhesive layer 40. As to the illustrated cross section, the position from which the display device DSP is observed is above the second substrate SUB2. The first substrate SUB1 comprises a base material 10, insulating films 11 to 14, a switching element SW, a metal film M and a pixel electrode PE.

The base material 10 is formed from an insulating glass, resin or the like. Since the base material 10 is located on an opposite side to the observation position, it may be opaque. The gate electrodes GE1 and GE2 integrated with the scanning line G1 are located on the base material 10, and are covered by the insulating film 11. The scanning line G1 and the gate electrodes GE1 and GE2 are formed a metal material such as aluminum (Al), titanium (Ti), silver (Ag), molybdenum (Mo), tungsten (W), copper (Cu) and chromium (Cr), or an alloy obtained by combining these metal materials, and they may have a single or multilayer structure. The semiconductor layer SC is located on the insulating film 11, and is covered by the insulating film 12. The semiconductor layer SC is formed of, for example, polycrystalline silicon, but may be formed of amorphous silicon, an oxide semiconductor or the like. The source electrode SE and the drain electrode DE integrated with the signal line S1 are located on the insulating film 12, and are covered by the insulating film 13. The signal line S1, the source electrode SE and the drain electrode DE are formed from an identical material, for example, the above-listed metal material. The source electrode SE is in contact with the semiconductor layer SC via the contact hole CH1 which penetrates the insulating film 12. The drain electrode DE is in contact with the semiconductor layer SC via the contact hole CH2 which penetrates the insulating film 12.

The metal film M is located on the insulating film 13, and is covered by the insulating film 14. The metal film M functions as, for example, a reflective film which reflects the incidence light from a second substrate SUB2 side, and also as a light-shielding layer which shields light directed towards the switching element SW from the second substrate SUB2 side. Moreover, the metal film M functions also as a capacitor electrode for securing the storage capacitance. The metal film M is formed from, for example, a metal material such as aluminum. As a specific example, the metal film M is formed from a multilayer of aluminum and titanium, a multilayer of aluminum and molybdenum, or the like.

The pixel electrode PE is located on the insulating film 14. The pixel electrode PE is formed from, for example, a transparent conductive material such as indium tin oxide (ITO) or indium zinc oxide (IZO). The pixel electrode PE opposes the metal film M via the insulating film 14. The pixel electrode PE is in contact with the drain electrode DE in a position superimposed on the opening OP via the contact hole CH3 which penetrates the insulating film 13 and the insulating film 14. In the formation of the contact hole CH3, for example, the insulating film 13 is etched, and then the insulating film 14 is etched. In this case, as illustrated, the insulating film 14 covers end portions of the insulating film 13, and thus the insulating film 13 is not in contact with the pixel electrode PE in the contact hole CH3. Note that in the formation of the contact hole CH3, the insulating films 13 and 14 may be etched collectively. In this case, the insulating film 14 does not cover the end portions of the insulating film 13, and end portions of the insulating film 14 overlap immediately above the end portions of the insulating film 13.

In this embodiment, the insulating films 11 to 14 are each formed from an inorganic insulating material such as silicon oxide (SiO), silicon nitride (SiN) or silicon oxynitride (SiON). The insulating films 11 to 14 may be of a single or multilayer structure. The insulating film 13 is equivalent to an inorganic insulating film in contact with each of the signal line S1, source electrode SE, the drain electrode DE and the metal film M. The insulating film 14 is equivalent to a capacitor insulating film interposed between the metal film M and the pixel electrode PE. For example, the insulating films 13 and 14 are formed of silicon nitride. The insulating film 14 is thinner than the insulating film 13. The insulating film 13 has a thickness 13T of, for example, 0.5 to 1.0 μm. The insulating film 14 has a thickness 14T of, for example, 0.1 to 0.3 μm. Moreover, in the example illustrated, the insulating film 13 has a thickness 13TB between the source electrode SE (or the signal line S1) and the drain electrode DE immediately above the scanning line G1. For example, the thickness 13TB is substantially equal to the thickness 13T of the regions which are not superimposed on the signal line S1 and the scanning line G1. The metal film M comprises a forward tapered end portion ME in the opening OP. As shown in a partially enlarged view in FIG. 3, an angle θ made between a side surface MS facing the opening OP of the metal film M and the insulating film 13 is an acute angle.

The second substrate SUB2 comprises a base material 20, a common electrode CE and an electrophoretic element 21. The base material 20 is formed from an insulating glass, resin or the like. The base material 20 is located on an observation position side, and therefore it is transparent. The common electrode CE is located between the base material 20 and the electrophoretic element 21. The common electrode CE is a transparent electrode formed from a transparent conductive material such as ITO or IZO. The common electrode CE is formed throughout the entire region of the display area DA shown in FIG. 1. To the common electrode CE, a common potential is supplied in, for example, the non-display area NDA. The electrophoretic element 21 comprises a plurality of microcapsules 30 arranged without any substantial gap.

The adhesive layer 40 is located between the pixel electrode PE and the electrophoretic element 21.

The microcapsules 30 are each a spherical body having a particle diameter of, for example, about 50 to 100 μm. In the example illustrated, a number of microcapsules 30 are shown to be arranged between one pixel electrode PE and the common electrode CE due to scaling, but in a square-shaped pixel PX with edges having a length of about hundreds of μm, one to about ten microcapsules 30 are disposed.

The microcapsules 30 each comprise a dispersion medium 31, a plurality of black particles 32 and a plurality of white particles 33. The black particles 32 and the white particles 33 may be referred to as electrophoretic particles. An outer shell portion (wall film) 34 of the microcapsule 30 is formed from, for example, a transparent resin such as an acrylic resin. The dispersion medium 31 is a liquid which disperse the black particles 32 and the white particles 33 in the respective microcapsule 30. The black particles 32 are (macromolecular or colloidal) particles consisting of, for example, black pigments such as aniline black and, for example, positively charged. The white particles 33 are (macromolecular or colloidal) particles consisting of, for example, white pigments such as titanium dioxide and are, for example, negatively charged. To these pigments, various additives may be added if needed. Moreover, in place of the black particles 32 and the white particles 33, for example, pigments of red, green, blue, yellow, cyan or magenta may be used.

In the electrophoretic element 21 of the above-described structure, to display black on a pixel PX, the pixel electrode PE is held at relatively a higher potential than that of the common electrode CE. That is, when the potential of the common electrode CE is referred to as a reference potential, the pixel electrode PE is held at positive polarity. Thus, the black particles 32 positively charged are attracted towards the common electrode CE, whereas the white particles 33 negatively charged are attracted towards the pixel electrode PE. As a result, when the pixel PX is observed from the common electrode CE side, it is viewed as black. On the other hand, to display white on the pixel PX, the potential of the common electrode CE is referred to as the referential potential, the pixel electrode PE is held at negative polarity. Thus, the white particles 33 negatively charged are attracted towards the common electrode CE side, whereas the black particles 32 positively charged are attracted towards the pixel electrode PE. As a result, when this pixel PX is viewed, it is observed as white.

FIG. 4 is a cross section of the pixel PX taken along line B-B' which crosses the signal line S1 in FIG. 2. The insulating film 13 is located on the signal line S1 and the insulating film 12, so as to be in contact with these. The insulating film 13 is formed from an inorganic insulating material as described above, and the surface thereof is not planarized. In other words, in the insulating film 13, a difference in level is created between the region 131 superimposed on the signal line S1 and the region 132 superimposed on the insulating film 12 without interposing the signal line S1 therebetween. The insulating film 13 has substantially an equal thickness 13T in both the region 131 and the region 132. Therefore, the level difference between the region 131 and the region 132 is equivalent to the thickness of the signal line S1. The thickness of the signal line S1 is, for example, 250 to 500 nm.

The metal film M is in contact with both of the regions 131 and 132 of the insulating film 13. The metal film M includes a difference in level between a region M1 superimposed on the signal line S1 and a region M2 not superimposed on the signal line S1. The region M1 is in contact with the region 131 and the region M2 is in contact with the region 132. Between the base material 10 and the region M2, the insulating films 11 to 13 are interposed, but there are no semiconductor layer, scanning line or signal line interposed therebetween. The metal film M has substantially a constant thickness, and the level difference between a region M1 and a region M2 is equivalent to the thickness ST of the signal line S1.

The pixel electrode PE is influenced by the level difference of the metal film M via the insulating film 14. The pixel electrode PE include a difference in level between a region PE1 superimposed on the signal line S1 and a region PE2 not superimposed on the signal line S1. The region PE1 is located immediately above the region 131 and the region M1, and the region PE2 is located immediately above the region 132 and the region M2. The insulating film 14 and the pixel electrode PE each have substantially a constant thickness, and the level difference between the region PE1 and the region PE2 is equivalent to the thickness ST of the signal line S1. Moreover, the level difference between the region PE1 and the region PE2 is equivalent to the level difference between the region M1 and the region M2.

In the pixel electrode PE, the region PE1 is equivalent to a first region, and the region PE2 is equivalent to a second region. In the metal film M, the region M1 is equivalent to a third region, and the region M2 is equivalent to a fourth region.

The adhesive layer 40 is in contact with the pixel electrode PE. The adhesive layer 40 has a thickness 41T in a region in contact with the region PE1, and has a thickness 42T in a region in contact with the region PE2. The thickness 42T is greater than the thickness 41T.

Figure 5:
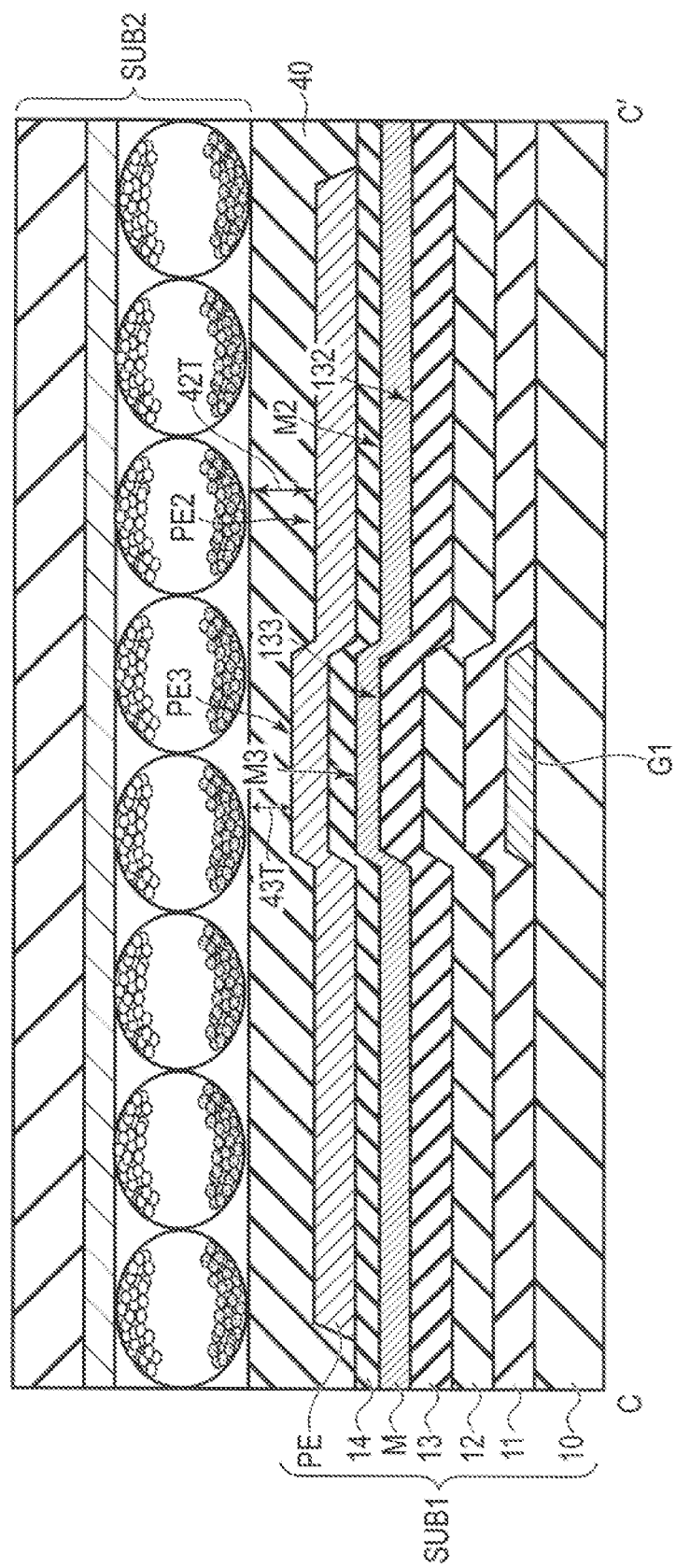
FIG. 5 is a cross section of the pixel PX, taken along line C-C' in FIG. 2, which crosses a scanning line G1.

FIG. 5 is a cross section of the pixel PX, taken along line C-C' which intersects the scanning line G1 shown in FIG. 2. The insulating film 13 is located above the scanning line G1 and the insulating film 12, and is in contact with these. The insulating film 13 includes a difference in level between a region 133 superimposed on the scanning line G1 and a region 132 superimposed on the insulating film 12 without interposing the scanning line G1 and the signal line S1 therebetween.

The metal film M is in contact with both of the regions 132 and 133 of the insulating film 13. The metal film M includes a difference in level between a region M3 superimposed on the scanning line G1 and a region M2 not superimposed on the scanning line G1 and the signal line S1. The region M3 is contact with the region 133. The pixel electrode PE includes a difference in level between a region PE3 superimposed on the scanning line G1 and a region PE2 not superimposed on the scanning line G1 and the signal line S1. The region PE3 is located immediately above the region 133 and the region M3. In the pixel electrode PE, the region PE3 is equivalent to the first region, and the region PE2 is equivalent to the second region. In the metal film M, the region M3 is equivalent to the third region, and the region M2 is equivalent to the fourth region. The adhesive layer 40 has a thickness 43T in a region in contact with the region PE3, and has a thickness 42T in a region in contact with the region PE2. The thickness 42T is greater than the thickness 43T.

Figure 6:
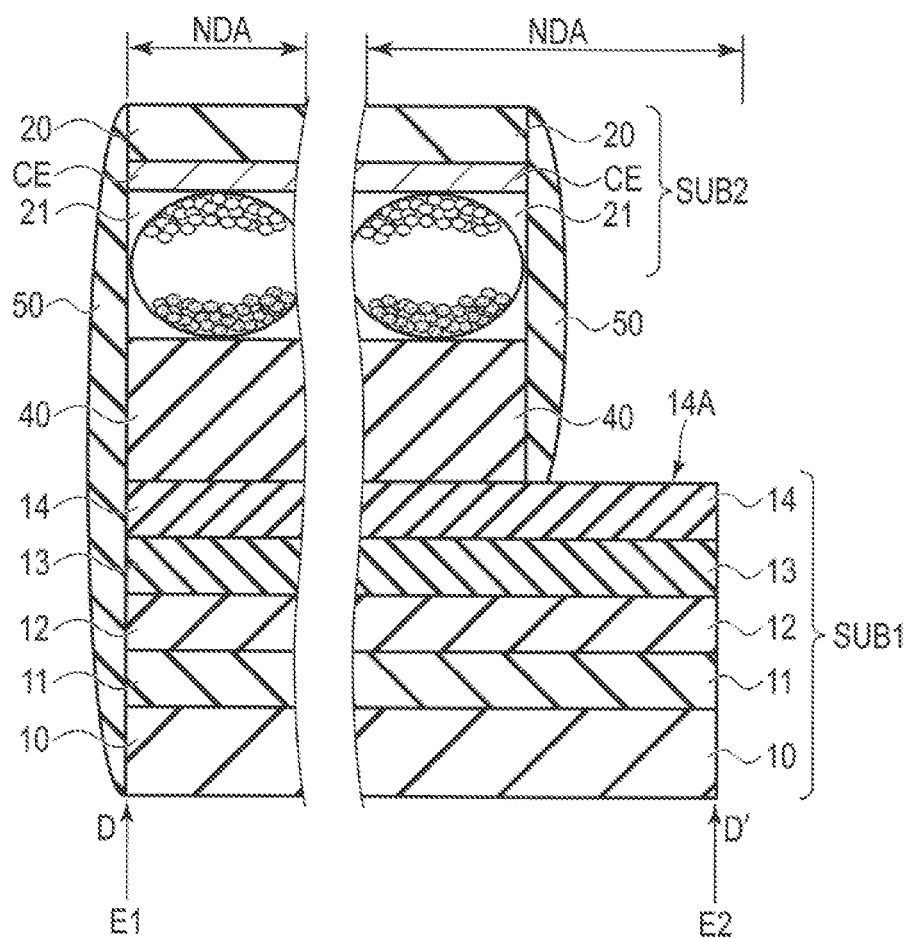
FIG. 6 is a local sectional view of a non-display area NDA of the display device DSP, taken along line D-D' in FIG. 1.

FIG. 6 is a partially cross sectional view of a non-display area NDA of the display device DSP, taken along line D-D' shown in FIG. 1. A sealing member 50 is formed from a waterproof epoxy resin or the like. The sealing member 50 is disposed to surround a circumference of each of, mainly, the second substrate SUB2, the electrophoretic element 21 and the adhesive layer 40. At an end portion (first end portion) on an edge E1 side, the sealing member 50 is in contact with each of the first substrate SUB1, the second substrate SUB2 and the adhesive layer 40. In the first substrate SUB1, an end surface of each of the base material 10 and the insulating films 11 to 14 is in contact with the sealing member 50. In the second substrate SUB2, end surfaces of the base material 20, the common electrode CE and the electrophoretic element 21 are in contact with the sealing member 50. At an end portion (second end portion) on an edge E2 side, the sealing member 50 is in contact with each of the second substrate SUB2 and the adhesive layer 40. In the first substrate SUB1, the sealing member 50 is in contact with an upper surface 14A of the insulating film 14.

According to this embodiment, the display device DSP comprises the inorganic insulating film 13 in contact with the metal film M. The adhesion between the inorganic insulating film 13 and the metal film M is stronger than that between organic insulating film and the metal film M. Further, the upper surface of the inorganic insulating film 13 is not planarized, the contact area between the metal film M and the inorganic insulating film 13 is greater as compared to the case where the upper surface is planarized. For this reason, when the opening OP is formed in the metal film M, the end portion ME of the forward tapered shape, which makes an acute angle of θs with respect to the inorganic insulating film 13, is formed. Moreover, the capacitor insulation film 14 which covers the metal film M is in tight contact with the side surface MS of the metal film M and the inorganic insulating film 13. Therefore, even if the thickness of the capacitor insulation film 14 is reduced, cutting of the film can be inhibited so as to prevent short-circuiting between the pixel electrode PE and the metal film M.

Moreover, with the capacitor insulation film 14 made thinner, the storage capacitance formed by the pixel electrode PE and the metal film M can be increased without changing the area where the pixel electrode PE and the metal film M are superimposed on each other.

Moreover, the inorganic insulating film 13 is in contact with each of the source electrode SE, the drain electrode DE and the metal film M. As compared to the organic insulating film, the inorganic insulating film 13 has a low water-absorptivity and contains a small initial amount of moisture, and further has a less moisture releasing amount. Therefore, the source electrode SE, the drain electrode DE and the metal film M can be prevented from corrosion. Moreover, all of the insulating films 11 to 14 are inorganic insulating films, and therefore the adhesion with each other can be improved. Thus, the paths of moisture, which may be formed in the interfaces between respective insulating films, can be blocked. Furthermore, moisture paths to the electrophoretic element 21 through the adhesive layer 40 can be blocked.

Thus, it is possible to improve the reliability. Further, as compared with the structure in which the first substrate SUB1 includes an organic insulating film, the display device DSP can be slimmed down.

Further, as shown in FIGS. 4 and 5, the pixel electrode PE includes the first region PE1 superimposed on the signal line S1, the first region PE3 superimposed on the scanning line G1, the second region PE2 not superimposed on the scanning line or the signal line, and the level difference between the first region PE1 or PE3 and the second region PE2. Therefore, as compared to the case where the pixel electrode PE does not include a level difference, the contact area between the adhesive layer 40 and the pixel electrode PE is greater, and the adhesion between the pixel electrode PE and the adhesive layer 40 can be improved. In this manner, the first substrate SUB1 and the second substrate SUB2 can be bonded firmly to each other.

Moreover, as shown in FIGS. 4 and 5, the metal film M includes the third region M1 superimposed on the signal line S1, the third region M3 superimposed on the scanning line G1 and the fourth region M2 not superimposed on the scanning line G1 or the signal line S1, and the level difference between the third region M1 or M3 and the fourth region M2. For this reason, as compared to the case where the metal film M does not include a level difference, the specular reflection of external light is suppressed, thereby making it possible to suppress degradation of the display quality, which may be caused by entering of light from a light source. Thus, the display quality can be therefore enhanced.

Moreover, as shown in FIG. 6, the sealing member 50 serves to inhibit the entering of moisture to the electrophoretic element 21 and the adhesive layer 40, and further the member is in contact with the inorganic insulating film 13. With this structure, moisture paths from the outside can be blocked and the degradation of the metal layer or the electrophoretic element 21 provided in the first substrate SUB1 by moisture can be suppressed. Further, the entering of moisture through the inorganic insulating film 13 can be suppressed as well, and therefore as compared to the case where the entering of moisture is inhibited only with the sealing member 50, there can be wider choices of material for the sealing member 50, thereby making it possible to select, for example, an inexpensive material in the selection of the material.

Next, a modified example of this embodiment will now be described.

Figure 7:
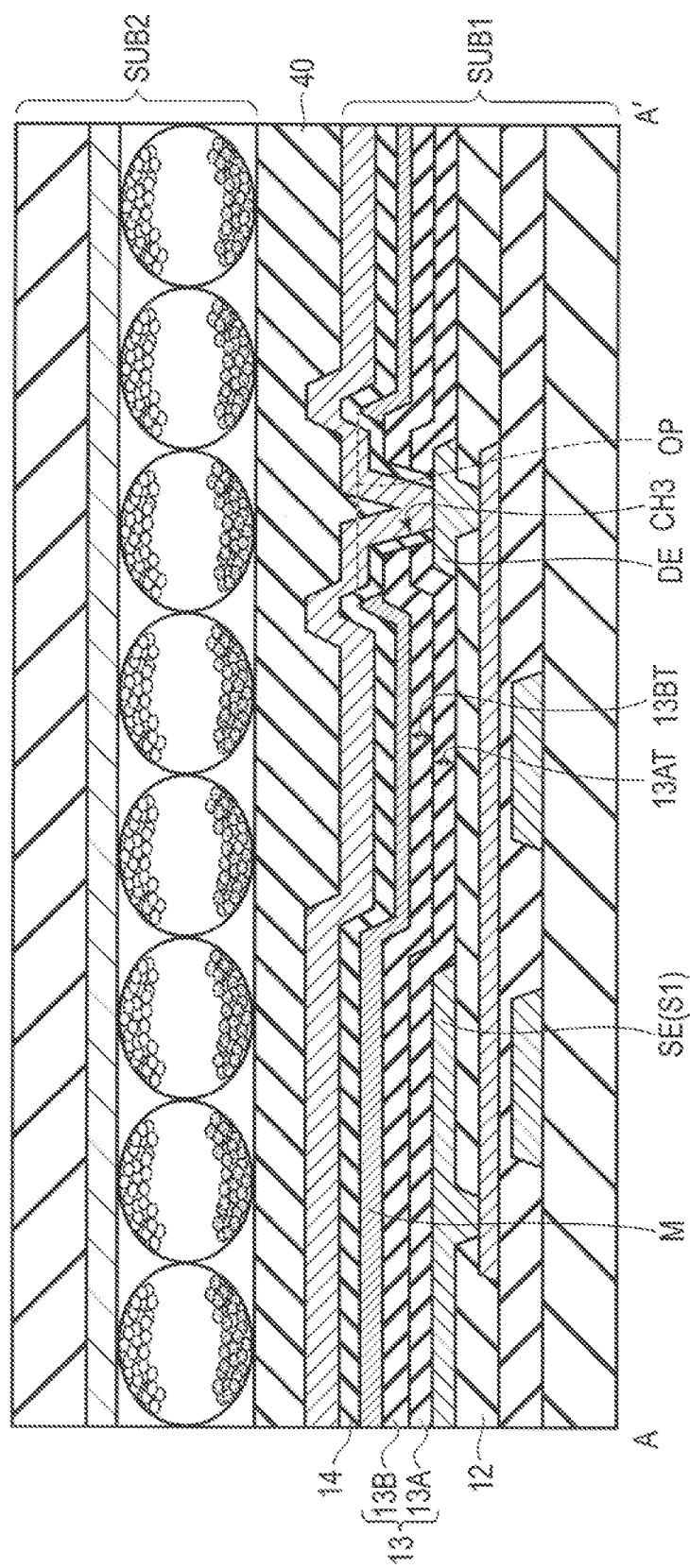
FIG. 7 is a diagram showing a cross section of a modified example of the pixel PX, taken along line A-A' in FIG. 2.

FIG. 7 is a cross section of a modified example of the pixel PX, taken along line A-A' line in FIG. 2. The modified example shown in FIG. 7 is different from that of FIG. 3 in that the insulating film 13 includes a first inorganic insulating film 13A and a second inorganic insulating film 13B. The first inorganic insulating film 13A is formed from a material different from that of the second inorganic insulating film 13B. The first inorganic insulating film 13A is in contact with each of the signal line S1, the source electrode SE, the drain electrode DE and the insulating film 12. The second inorganic insulating film 13B is stacked on the first inorganic insulating film 13A and brought into contact with the metal film M, and also is in contact with the insulating film 14 in the opening OP of the metal film M. The contact hole CH3 penetrates the first inorganic insulating film 13A and the second inorganic insulating film 13B through to the drain electrode DE. In the example illustrated, in the contact hole CH3, the insulating film 14 is in contact with both of the first inorganic insulating film 13A and the second inorganic insulating film 13B. The first inorganic insulating film 13A is formed from the identical material to that of the insulating film 14. Thickness 13AT of the first inorganic insulating film 13A is different from the thickness 13BT of the second inorganic insulating film 13B.

For example, the first inorganic insulating film 13A is formed of silicon nitride (SiN), and the second inorganic insulating film 13B is formed of silicon oxide (SiO). The thickness 13AT is greater than the thickness 13BT. Here, the insulating film 13 is formed from two different inorganic insulating films, but the insulating film 13 may be formed from more inorganic insulating films.

In this modified example, advantageous effects similar to those of the above-explained embodiment can be obtained. Additionally, in the formation of the inorganic insulating film 13, the first inorganic insulating film 13A and the second inorganic insulating film 13B can be combined freely in consideration of the characteristics required (for example, the ease of film forming, the ease of etching, moisture permeability, adhesion with various metal layers and the like).

For example, as the second inorganic insulating film 13B, an inorganic insulating film exhibiting high adhesion with the metal film M can be used, and as the first inorganic insulating film 13A, an inorganic insulating film exhibiting high adhesion with the signal line S1, the source electrode SE and the drain electrode DE can be used. Thus, the inorganic insulating film 13 exhibiting high adhesion with all of the metal film M, the signal line S1, the source electrode SE and the drain electrode DE can be prepared.

Moreover, as the second inorganic insulating film 13B, an inorganic insulating film exhibiting high adhesion with the metal film M can be used, and as the first inorganic insulating film 13A, an inorganic insulating film formable in a shorter time than that of the second inorganic insulating film 13B or an inorganic insulating film etchable in a shorter time than that of the second inorganic insulating film 13B can be used. In this case, the first inorganic insulating film 13A should be formed thicker than the second inorganic insulating film 13B, and thus the inorganic insulating film 13 with a required thickness can be formed in a short time.

As described, according to the embodiment, a display device with improved reliability can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a switching element comprising a source electrode and a drain electrode;
an inorganic insulating film in contact with the source electrode and the drain electrode;
a metal film in contact with the inorganic insulating film and comprising an opening in a position superimposed on the drain electrode;
a capacitor insulating film covering the metal film;
a pixel electrode located on the capacitor insulating film and electrically connected to the drain electrode;
an electrophoretic element located on the pixel electrode; and
a common electrode located on the electrophoretic element,
the metal film comprising a forward tapered end portion in the opening.

2. The device of claim 1, wherein
the capacitor insulating film is thinner than the inorganic insulating film.

3. The device of claim 2, further comprising:
a scanning line and a signal line electrically connected to the switching element; and
an adhesive layer in contact with the pixel electrode, wherein
the pixel electrode includes a first region superimposed on at least one of the scanning line and the signal line, and a second region not superimposed on the scanning line or the signal line, and includes a difference in level between the first region and the second region.

4. The device of claim 3, wherein
the metal film includes a third region superimposed on at least one of the scanning line and the signal line, and a fourth region not superimposed on the scanning line or the signal line, and includes a difference in level between the third region and the fourth region.

5. The device of claim 4, wherein
the first region is located immediately above the third region,
the second region is located immediately above the fourth region, and
the difference in level between the third region and the fourth region is substantially equal to that between the first region and the second region.

6. The device of claim 5, wherein
the adhesive layer is located between the pixel electrode and the electrophoretic element, and has a first thickness immediately above the first region, and a second thickness immediately above the second region, and
the second thickness is greater than the first thickness.

7. The device of claim 6, wherein
the inorganic insulating film has a third thickness immediately under the first region and a fourth thickness immediately under the second region, and
the third thickness is substantially equal to the fourth thickness.

8. The device of claim 1, wherein
the inorganic insulating film includes a first inorganic insulating film in contact with the source electrode and the drain electrode, and a second inorganic insulating film in contact with the metal film, the second inorganic insulating film is stacked on the first inorganic insulating film, and the first inorganic insulating film is formed from a material different from that of the second inorganic insulating film.

9. The device of claim 8, wherein the first inorganic insulating film is formed from an identical material to that of the capacitor insulating film.

10. The device of claim 9, wherein a thickness of the first inorganic insulating film is different from that of the second inorganic insulating film.

11. The device of claim 10, wherein the first inorganic insulating film is thicker than the second inorganic insulating film.

12. The device of claim 8, wherein in a contact hole which electrically connects the drain electrode and the pixel electrode to each other, the capacitor insulating film covers an end portion of each of the first inorganic insulating film and the second inorganic insulating film, and each of the first inorganic insulating films and the second inorganic insulating films is not in contact with the pixel electrode.

13. The device of claim 1, wherein in a contact hole which electrically connects the drain electrode and the pixel electrode to each other, the capacitor insulating film covers an end portion of the inorganic insulating film and the inorganic insulating film is spaced from the pixel electrode.

14. A display device comprising:

a first substrate comprising a base material, a switching element located on the base material and including a source electrode and a drain electrode, an inorganic insulating film in contact with the source electrode and the drain electrode, a metal film in contact with the inorganic insulating film and comprising an opening in a position superimposed on the drain electrode, a capacitor insulating film covering the metal film, and a pixel electrode located on the capacitor insulating film and electrically connected to the drain electrode;

a second substrate comprising a common electrode;

an electrophoretic element located between the pixel electrode and the common electrode; and a sealing member disposed around the second substrate and the electrophoretic element, the first substrate including a first end portion and a second end portion on an opposite side to the first end portion, the sealing member being in contact with an end surface of each of the inorganic insulating film and the capacitor insulating film in the first end, and the sealing member being in contact with an upper surface of the capacitor insulating film in the second end.

15. The device of claim 14, further comprising:

a scanning line and a signal line electrically connected to the switching element; and an adhesive layer in contact with the pixel electrode, wherein the pixel electrode comprises a first region superimposed on at least one of the scanning line and the signal line, and a second region not superimposed on the scanning line or the signal line, the adhesive layer is located between the pixel electrode and the electrophoretic element, and has a first thickness immediately above the first region and a second thickness immediately above the second region, and the second thickness is greater than the first thickness.

16. The device of claim 15, wherein the inorganic insulating film has a third thickness immediately under the first region, and a fourth thickness immediately under the second region, and the third thickness is substantially equal to the fourth thickness.

17. The device of claim 14, wherein the inorganic insulating film includes a first inorganic insulating film in contact with the source electrode and the drain electrode, and a second inorganic insulating film in contact with the metal film, the second inorganic insulating film is stacked on the first inorganic insulating film, and the first inorganic insulating film is formed from a material different from that of the second inorganic insulating film, and is formed from an identical material to that of the capacitor insulating film.

18. The device of claim 17, wherein the first inorganic insulating film is thicker than that of the second inorganic insulating film.

19. The device of claim 17, wherein in a contact hole which electrically connects the drain electrode and the pixel electrode to each other, the capacitor insulating film covers an end portion of each of the first inorganic insulating film and the second inorganic insulating film, and each of the first inorganic insulating films and the second inorganic insulating films is not in contact with the pixel electrode.

20. The device of claim 14, wherein in a contact hole which electrically connects the drain electrode and the pixel electrode to each other, the capacitor insulating film covers an end portion of the inorganic insulating film and the inorganic insulating film is not in contact with the pixel electrode.

* * * * *